US012107548B2

(12) United States Patent
Huang et al.

(10) Patent No.: US 12,107,548 B2
(45) Date of Patent: Oct. 1, 2024

(54) AMPLIFIER CIRCUIT

(71) Applicant: RichWave Technology Corp., Taipei (TW)

(72) Inventors: Pin-Yi Huang, Taipei (TW); Chih-Sheng Chen, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 372 days.

(21) Appl. No.: 17/229,809

(22) Filed: Apr. 13, 2021

(65) Prior Publication Data

US 2021/0359646 A1 Nov. 18, 2021

Related U.S. Application Data

(60) Provisional application No. 63/023,260, filed on May 12, 2020.

(51) Int. Cl.
*H03G 3/12* (2006.01)
*H03F 1/02* (2006.01)
(Continued)

(52) U.S. Cl.
CPC ............ *H03F 1/0205* (2013.01); *H03F 3/19* (2013.01); *H03G 3/30* (2013.01); *H03F 1/083* (2013.01); *H03F 1/223* (2013.01)

(58) Field of Classification Search
CPC . H03F 1/0205; H03F 3/19; H03F 3/72; H03F 2200/144; H03F 2200/156; H03F 2200/213; H03F 2200/216; H03F 2200/225; H03F 2200/252; H03F 1/223; H03F 1/3205; H03F 1/565; H03F 3/21; H03F 3/193; H03F 2200/222; H03F 2200/243; H03F 2200/294; H03F 2200/297; H03F 2200/301; H03F 2200/306;
(Continued)

(56) References Cited

U.S. PATENT DOCUMENTS

| 6,522,195 B2 * | 2/2003 | Watanabe | H03F 3/72 330/51 |
| 7,633,337 B2 * | 12/2009 | Nam | H03F 1/42 330/254 |

(Continued)

OTHER PUBLICATIONS

Office action mailed on May 24, 2024 for the EP application No. 21170616.3, filing date Apr. 27, 2021, pp. 1-10.

*Primary Examiner* — Khanh V Nguyen
(74) *Attorney, Agent, or Firm* — Winston Hsu

(57) ABSTRACT

An amplifier circuit includes an input terminal used to receive an input signal, an output terminal used to output an output signal, an amplification unit, and a phase adjustment unit. The amplification unit includes an input terminal coupled to the input terminal of the amplifier circuit, an output terminal coupled to the output terminal of the amplifier circuit, a first terminal coupled to a first voltage terminal, and a second terminal coupled to a second voltage terminal. The phase adjustment unit is coupled to the amplification unit. When the amplifier circuit is operated in a first mode, the output signal has a first phase, and when the amplifier circuit is operated in a second mode, the output signal has a second phase. A difference between the first phase and the second phase is within a predetermined range.

19 Claims, 7 Drawing Sheets

(51) Int. Cl.
*H03F 3/19* (2006.01)
*H03G 3/30* (2006.01)
*H03F 1/08* (2006.01)
*H03F 1/22* (2006.01)

(58) Field of Classification Search
CPC ......... H03F 2200/309; H03F 2200/312; H03F 2200/387; H03F 2200/391; H03F 2200/399; H03F 2200/402; H03F 2200/42; H03F 2200/451; H03F 2200/48; H03F 2200/489; H03F 2200/492; H03F 2200/546; H03F 2200/75; H03G 3/30; H03G 1/0029; H03G 1/0088; H03G 3/001; H03G 2201/307; H03G 2201/502; H03G 3/20
USPC .......... 330/277, 86, 107, 109, 282, 290–294
See application file for complete search history.

(56) References Cited

U.S. PATENT DOCUMENTS

| | | | | |
|---|---|---|---|---|
| 7,724,039 | B2 * | 5/2010 | Arai | H03F 3/45 |
| | | | | 330/277 |
| 8,378,748 | B2 * | 2/2013 | Heikkinen | H03F 1/26 |
| | | | | 330/51 |
| 9,077,290 | B2 * | 7/2015 | Din | H03F 3/193 |
| 9,319,009 | B2 * | 4/2016 | Connell | H04B 1/123 |
| 9,831,841 | B2 * | 11/2017 | Wu | H03F 1/02 |
| 10,110,166 | B1 * | 10/2018 | Noori | H03B 5/1215 |
| 10,476,460 | B2 * | 11/2019 | Lee | H03G 1/0029 |
| 2003/0214357 | A1 * | 11/2003 | Cho | H03G 1/007 |
| | | | | 330/282 |
| 2005/0062540 | A1 * | 3/2005 | Nakatani | H03F 1/34 |
| | | | | 330/294 |
| 2005/0110572 | A1 * | 5/2005 | Morimoto | H03F 3/19 |
| | | | | 330/294 |
| 2006/0176112 | A1 | 8/2006 | Nakatani | |
| 2007/0024377 | A1 * | 2/2007 | Wang | H03F 1/42 |
| | | | | 330/305 |
| 2008/0231369 | A1 | 9/2008 | Kim | |
| 2009/0051441 | A1 | 2/2009 | Branch | |
| 2009/0066418 | A1 * | 3/2009 | Satou | H03F 1/223 |
| | | | | 330/277 |
| 2014/0266461 | A1 | 9/2014 | Youssef | |
| 2015/0091650 | A1 * | 4/2015 | Nobbe | H03F 1/223 |
| | | | | 330/291 |
| 2015/0230185 | A1 | 8/2015 | Vahid Far | |
| 2016/0276981 | A1 | 9/2016 | Kang | |
| 2018/0062599 | A1 | 3/2018 | Lee | |
| 2018/0123523 | A1 | 5/2018 | Vujcic | |
| 2019/0312553 | A1 | 10/2019 | Kim | |

* cited by examiner

AMPLIFIER CIRCUIT

CROSS REFERENCE TO RELATED APPLICATION

This non-provisional application claims priority of U.S. provisional application No. 63/023260, filed on 12 May, 2020, included herein by reference in its entirety.

TECHNICAL FIELD

The invention relates to an amplifier circuit, and specifically, to a multi-gain amplifier circuit having phase control.

BACKGROUND

The increasing use of network devices and mobile devices has driven the need for quality communication, and therefore, amplifiers are often adopted in the network devices and the mobile devices to enhance the signal quality. The amplifiers can utilize various circuit configurations to properly process received signals, thereby enhancing the signal quality. Nevertheless, the various circuit configurations will also affect the phase of the output signal of the amplifiers to various degrees, resulting in variation in the phases of the output signals.

SUMMARY

According to one embodiment of the invention, an amplifier circuit includes an input terminal used to receive an input signal, an output terminal used to output an output signal, an amplification unit, and a first phase adjustment unit comprising a first terminal and a second terminal. The amplification unit includes an input terminal coupled to the input terminal of the amplifier circuit, an output terminal coupled to the output terminal of the amplifier circuit, a first terminal coupled to a first voltage terminal, and a second terminal coupled to a second voltage terminal. The first terminal of the first phase adjustment unit is coupled to the input terminal of the amplifier circuit, and the second terminal of the first phase adjustment unit is coupled to the input terminal of the amplification unit; or the first terminal of the first phase adjustment unit is coupled to the second terminal of the amplification unit, and the second terminal of the first phase adjustment unit is coupled to the second voltage terminal; or the first terminal of the first phase adjustment unit is coupled to the output terminal of the amplification unit, and the second terminal of the first phase adjustment unit is coupled to the output terminal of the amplifier circuit; or the first terminal of the first phase adjustment unit is coupled to the first voltage terminal, and the second terminal of the first phase adjustment unit is coupled to the first terminal of the amplification unit; or the first terminal of the first phase adjustment unit is coupled to the input terminal of the amplification unit, and the second terminal of the first phase adjustment unit is coupled to the second voltage terminal; or the first terminal of the first phase adjustment unit is coupled to the first terminal of the amplification unit, and the second terminal of the first phase adjustment unit is coupled to the input terminal of the amplification unit; or the first terminal of the first phase adjustment unit is coupled to the input terminal of the amplification unit, and the second terminal of the first phase adjustment unit is coupled to the second terminal of the amplification unit. When the amplifier circuit is operated in a first mode, the output signal has a first phase, and when the amplifier circuit is operated in a second mode, the output signal has a second phase. A difference between the first phase and the second phase is within a predetermined range.

DETAILED DESCRIPTION

Figure 1:
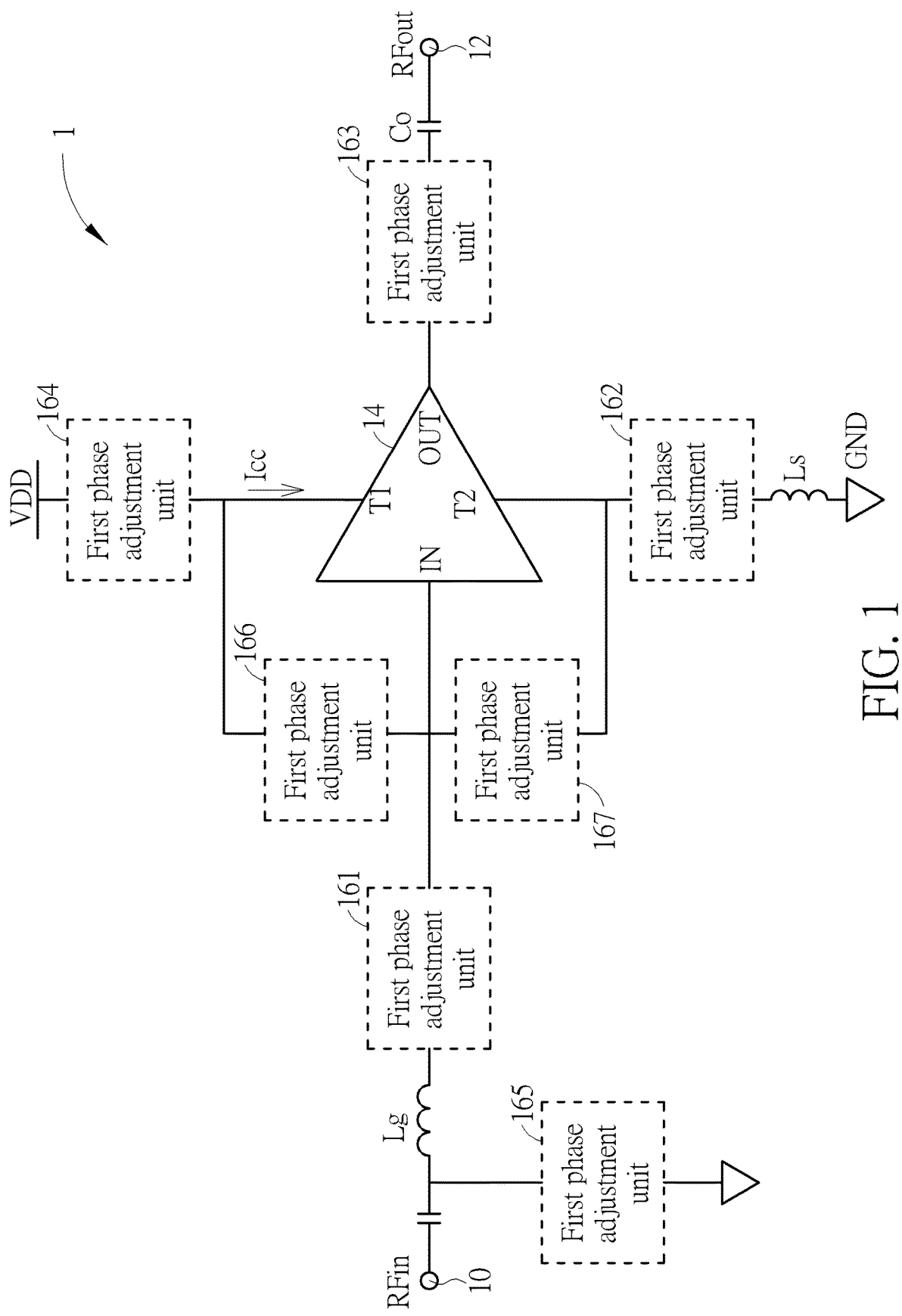
FIG. 1 is a block diagram of an amplifier circuit according to an embodiment of the invention.

Below, exemplary embodiments will be described in detail with reference to accompanying drawings so as to be easily realized by a person having ordinary knowledge in the art. The inventive concept maybe embodied in various forms without being limited to the exemplary embodiments set forth herein. Descriptions of well-known parts are omitted for clarity, and like reference numerals refer to like elements throughout.

FIG. 1 is a block diagram of an amplifier circuit 1 according to an embodiment of the invention. The amplifier circuit 1 includes an input terminal 10, an output terminal 12, and an amplification unit 14. The input terminal 10 is configured to receive an input signal RFin. The output terminal 12 is configured to output an output signal RFout. The input signal RFin and the output signal RFout may be radio frequency signals. The amplification unit 14 includes an input terminal IN, an output terminal OUT, a first terminal T1 and a second terminal T2. The input terminal IN of the amplification unit 14 is coupled to the input terminal 10 of the amplifier circuit 1, the output terminal OUT of the amplification unit 14 is coupled to the output terminal 12 of the amplifier circuit 1, the first terminal T1 of the amplification unit 14 is coupled to a voltage terminal VDD and the second terminal T2 of the amplification unit 14 is coupled to a voltage terminal GND. In some embodiments, a voltage at the voltage terminal VDD may be higher than a voltage at the voltage terminal GND. For example, the voltage at the voltage terminal VDD may be, but is not limited to, an operating voltage in the system, and the voltage at the voltage terminal GND may be, but is not limited to, a ground voltage in the system. The amplifier circuit 1 may serve as a power amplifier or a low noise amplifier.

The gain of the amplifier circuit 1 may be controlled by: 1. changing a supply current Icc consumed by the amplification unit 14; 2. configuring a capacitance of a capacitor between the input terminal IN and the second terminal T2 of the amplification unit 14; and/or 3. changing an impedance of a feedback path between the first terminal T1 and the input terminal IN of the amplification unit 14.

In some embodiments, the amplifier circuit 1 may operate in one of a plurality of gain modes, the plurality of gain modes including but not limited to a high gain mode, a low gain mode and a bypass mode. For example, when the amplifier circuit 1 is operated in the high gain mode, the amplifier circuit 1 has a high gain, e.g., 20 dB; when the amplifier circuit 1 is operated in the low gain mode, the amplifier circuit 1 has an intermediate gain between the high gain and 0 dB, e.g., 10 dB; and when the amplifier circuit 1 is operated in the bypass mode, the amplifier circuit 1 has a bypass gain less than 0 dB, e.g., −10 dB.

However, in the high gain mode, the gain is increased by: 1. increasing a transistor size of transistors in the amplification unit 14 by, for example, increasing the total width of the transistors, thereby increasing the supply current Icc; 2. reducing the capacitance of the capacitor between the input terminal IN and the second terminal T2 of the amplification unit 14; and/or 3. increasing the overall impedance of the feedback path between the first terminal T1 and the input terminal IN of the amplification unit 14, thereby decreasing the feedback amount in the feedback path. In one example, the feedback amount may be the power of a feedback signal in the feedback path. When the transistor size of the transistors in the amplification unit 14 is increased, the supply current Icc will be increased accordingly, increasing the gain and resulting in a lagging phase shift. When the capacitance of the capacitor is reduced, the gain will be increased and resulting in a leading phase shift. When both the increased transistor size and the reduced capacitance of the capacitor are adopted, the phase of the output signal RFout will be determined by a combinational result of the lagging phase shift owing to the increased transistor size and the leading phase shift owing to the reduced capacitance of the capacitor.

Furthermore, in the low gain mode, the gain is reduced by: 1. reducing the transistor size of the transistors in the amplification unit 14 by, for example, reducing the total width of the transistors, thereby reducing the supply current Icc; 2. increasing the capacitance of the capacitor between the input terminal IN and the second terminal T2 of the amplification unit 14; and/or 3. reducing the overall impedance of the feedback path between the first terminal T1 and the input terminal IN of the amplification unit 14, thereby increasing the feedback amount in the feedback path. When the transistor size of the transistors in the amplification unit 14 is decreased, the supply current Icc will be decreased accordingly, decreasing the gain and resulting in a leading phase shift. When the capacitance of the capacitor is increased, the gain will be decreased and the phase will be delayed, resulting in a lagging phase shift. When both the decreased transistor size and the increased capacitance of the capacitor are adopted, the phase of the output signal RFout will be determined by a combinational result of the leading phase shift owing to the decreased transistor size and the lagging phase shift owing to the increased capacitance of capacitor.

Accordingly, the transistor size and the capacitance of the capacitor are selected to provide the adequate gain levels, and will affect the phases of the output signals RFout in the high gain mode and low gain mode considerably.

Further, in the related art, the bypass mode is implemented by using a switch to enable a bypass path connecting between the input terminal 10 of the amplifier circuit 1 and the output terminal 12 of the amplifier circuit 1, thereby passing the input signal RFin from the input terminal 10 of the amplifier circuit 1 to the output terminal 12 of the amplifier circuit 1 without passing through the amplification unit 14. Since the input signal RFin is directed to the output terminal 12 of the amplifier circuit 1 without going through the amplification unit 14, the transistors in the amplification unit 14 may be turned off, the phase of the output signal RFout may be substantially equal to the phase of the input signal RFin, and may be very different from the phases of the output signals RFout in the high gain mode and the low gain mode. Therefore, the phases of the output signals RFout in the various gain modes may differ from each other by a great range. When in operation, an electronic system may be required to determine the gains and phases of the amplifier circuit 1 for calibration. If the phases are different for the various gain modes, the electronic system may need to determine the phase upon each gain mode change, increasing a signal processing time.

One or more members of the first phase adjustment units 161 to 167 may be included in the amplifier circuit 1 to maintain the phases of the output signals RFout substantially unchanged or varying within a small predetermined range in the various gain modes. Each of the first phase adjustment units 161 to 167 includes a first terminal and a second terminal. The first terminal of the first phase adjustment unit 161 is coupled to the input terminal 10 of the amplifier circuit 1, and the second terminal of the first phase adjustment unit 161 is coupled to the input terminal IN of the amplification unit 14. The first terminal of the first phase adjustment unit 162 is coupled to the second terminal T2 of the amplification unit 14, and the second terminal of the first phase adjustment unit 162 is coupled to the voltage terminal GND. The first terminal of the first phase adjustment unit 163 is coupled to the output terminal OUT of the amplification unit 14, and the second terminal of the first phase adjustment unit 163 is coupled to the output terminal 12 of the amplifier circuit 1. The first terminal of the first phase adjustment unit 164 is coupled to the voltage terminal VDD, and the second terminal of the first phase adjustment unit 164 is coupled to the first terminal T1 of the amplification unit 14. The first terminal of the first phase adjustment unit 165 is coupled to the input terminal IN of the amplification unit 14, and the second terminal of the first phase adjustment unit 165 is coupled to the voltage terminal GND. The first terminal of the first phase adjustment unit 166 is coupled to the first terminal T1 of the amplification unit 14, and the second terminal of the first phase adjustment unit 166 is coupled to the input terminal IN of the amplification unit 14. In particular, the first phase adjustment unit 166 may be disposed on the feedback path. The first terminal of the first phase adjustment unit 167 is coupled to the input terminal IN of the amplification unit 14, and the second terminal of the first phase adjustment unit 167 is coupled to the second terminal T2 of the amplification unit 14. In some embodiments, one or a combination of the first phase adjustment unit 161 to 167 may be selectively adopted to satisfy application and design requirements.

The impedances of the first phase adjustment units 161 to 167 are adjustable to compensate for the phase change of the output signal RFout for each of the gain modes. In particular, the first phase adjustment units 161 to 163 may be configured to adjust inductance. The first phase adjustment units 164 and 165 may be configured to adjust capacitance and inductance. The first phase adjustment unit 166 may be configured to adjust inductance or may be configured to adjust capacitance and resistance. The first phase adjustment unit 167 may be configured to adjust capacitance. In some embodiments, the first phase adjustment unit 161, 162 or 163 may include a variable inductor. The first phase adjustment unit 164, 165 or 166 may include a variable impedance component. The first phase adjustment unit 167 may include a variable capacitor. In some embodiments, the first phase adjustment units 161 to 167 may adjust the gain of the amplifier circuit 1 by adjusting the impedance thereof.

The amplifier circuit 1 may further include inductors Lg and Ls and a capacitor Co. The inductor Lg includes a first terminal coupled to the input terminal 10 of the amplifier circuit 1, and a second terminal coupled to the first terminal of the first phase adjustment unit 161. In some embodiments, the inductor Lg and the first phase adjustment unit 161 may swap places, so that the second terminal of the first phase adjustment unit 161 may be coupled to the input terminal IN of the amplification unit 14 through the inductor Lg. The inductor Ls includes a first terminal coupled to the second terminal of the first phase adjustment unit 162, and a second terminal coupled to the voltage terminal GND. In some embodiments, the inductor Ls and the first phase adjustment unit 162 may swap places, so that the first terminal of the first phase adjustment unit 162 may be coupled to the second terminal T2 of the amplification unit 14 through the inductor LS. The inductors Lg and Ls may be used for impedance matching of the amplifier circuit 1. The capacitor Co includes a first terminal coupled to the second terminal of the first phase adjustment unit 163, and a second terminal coupled to the output terminal 12 of the amplifier circuit 1. In some embodiments, the capacitor Co and the first phase adjustment unit 163 may swap places, so that the first terminal of the first phase adjustment unit 163 may be coupled to the output terminal OUT of the amplification unit 14 through the capacitor Co. The capacitor Co may be a DC block capacitor.

The configurations for the three gain modes are provided in the following paragraphs to serve for exemplary purposes only, and are not intended to limit the scope of the invention.

In some embodiments, the amplifier circuit 1 may selectively operate in the high gain mode, the low gain mode or the bypass mode according to the power of the input signal RFin. When the input signal RFin has a first power, the amplifier circuit 1 may be operated in the high gain mode and the output signal RFout has a first phase; when the input signal RFin has a second power, the amplifier circuit 1 may be operated in the low gain mode and the output signal RFout has a second phase; and when the input signal RFin has a third power, the amplifier circuit 1 may be operated in the bypass mode and the output signal RFout has a third phase. The third power is higher than the second power, and the second power is higher than the first power. In some embodiments, the phases of the output signal RFout may be maintained substantially unchanged or varying within the small predetermined range in the various gain modes by controlling a phase difference between any two adjacent gain modes. Further, a phase difference between the high gain mode and the low gain mode or a phase difference between the low gain mode and the bypass mode may be controlled within a tolerance value T°. Table 1 shows exemplary phase angles of the first phase, the second phase and the third phase.

TABLE 1

|  | First phase (°) | Second phase (°) | Third phase (°) |
| --- | --- | --- | --- |
| Case 1 | N + T | N | N + T |
| Case 2 | N − T | N | N − T |
| Case 3 | N + T | N | N − T |

TABLE 1-continued

|  | First phase (°) | Second phase (°) | Third phase (°) |
| --- | --- | --- | --- |
| Case 4 | N − T | N | N + T |
| Case 5 | N | N + T | N + 2T |
| Case 6 | N | N + T | N |

Table 1 shows that the phase difference between adjacent modes is controlled within the tolerance value T°. For example, in Case 5, the first phase may be set at N°, the second phase may be set at (N+T)°, and the third phase may be set at (N+2T)°. The impedances of at least one of the first phase adjustment units 161 to 167 may be adjusted to control the phase difference within the tolerance value T°. The tolerance value T° may be regarded as the predetermined range. In this manner, a difference between the first phase and the second phase or a difference between the second phase and the third phase may be controlled within the predetermined range. In another embodiment, the phases of the output signal RFout may be maintained substantially unchanged or varying within the small predetermined range in the various gain modes by selecting one of the first phase, the second phase and the third phase as a reference phase of the amplifier circuit 1. The reference phase may be set to a target phase N°, and the remaining phases of the first phase, the second phase and the third phase may be set to a target phase (N+T)° or (N−T)°. For example, in Case 4, the second phase may be selected as the reference phase of the amplifier circuit 1, and may be set to the target phase N°, the first phase may be set to the target phase (N−T)°, and the third phase may be set to the target phase (N+T)°. The impedances of at least one of the first phase adjustment units 161 to 167 may be adjusted to meet the respective target phases in the high gain mode, the low gain mode, and the bypass mode. The tolerance value T° may be regarded as the predetermined range. In this manner, a difference between the first phase and the second phase or a difference between the second phase and the third phase may be within the predetermined range. In the above embodiment, N° may be a value from −180 to 180, the tolerance value T° may be a value from 0 to 25. In other embodiments, the range of the tolerance value T° may be set based on the actual applications and design requirements.

Figure 2:
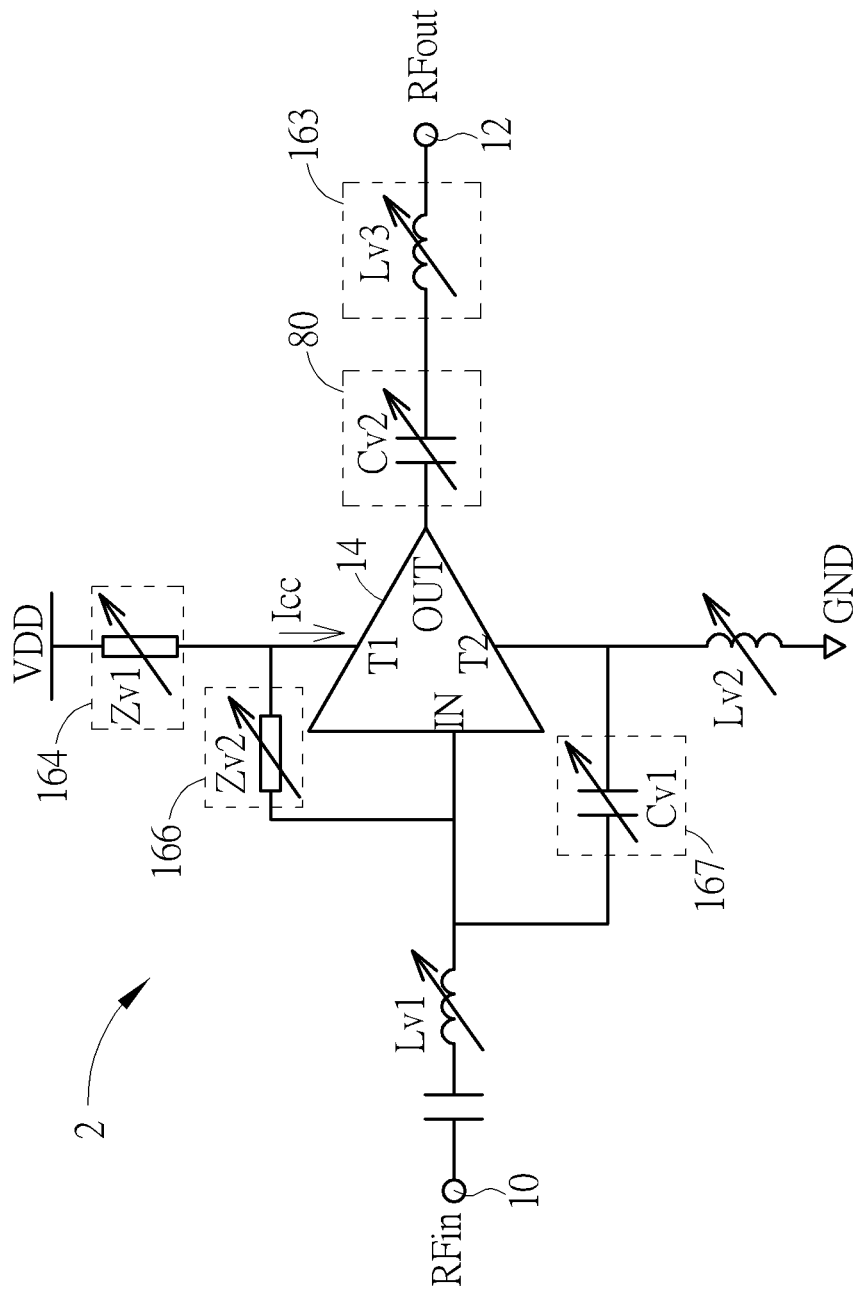
FIG. 2 is a circuit schematic of an amplifier circuit according to another embodiment of the invention.

FIG. 2 is a circuit schematic of an amplifier circuit 2 according to another embodiment of the invention. The main difference between the amplifier circuit 2 and the amplifier circuit 1 is that the amplifier circuit 2 employs the first phase adjustment units 163, 164, 166 and 167, and further includes variable inductors Lv1 and Lv2 and a second phase adjustment unit 80. The first phase adjustment unit 161 in FIG. 1 and the inductor Lg in FIG. 1 may be integrated into the variable inductor Lv1. The variable inductor Lv1 includes a first terminal coupled to the input terminal 10 of the amplifier circuit 2, and a second terminal coupled to the input terminal IN of the amplification unit 14. The first phase adjustment unit 162 in FIG. 1 and the inductor Ls in FIG. 1 may be integrated into the variable inductor Lv2. The variable inductor Lv2 includes a first terminal coupled to the second terminal T2 of the amplification unit 14, and a second terminal coupled to the voltage terminal GND. The variable inductors Lv1 and Lv2 may be used to not only provide impedance matching of the amplifier circuit 2, but may also deliver the desired gain while maintaining the phases change of the output signal RFout within the predetermined range. The first phase adjustment unit 163 may include a variable inductor Lv3. The first phase adjustment unit 164 may include a variable impedance component Zv1. The first phase adjustment unit 166 may include a variable impedance component Zv2. The first phase adjustment unit 167 may include a variable capacitor Cv1. Explanations for the configurations and the operations of the inductors Lg and Ls and the first phase adjustment units 161, 162, 163, 164, 166 and 167 are provided in the preceding paragraphs and will not be repeated here for brevity.

The second phase adjustment unit 80 includes a first terminal coupled to the output terminal OUT of the amplification unit 14, and a second terminal coupled to the output terminal 12 of the amplifier circuit 2. Further, the second terminal of the second phase adjustment unit 80 is coupled to the output terminal 12 of the amplifier circuit 2 via the first phase adjustment unit 163. In some embodiments, the second phase adjustment unit 80 and the first phase adjustment unit 163 may swap places, so that the first terminal of the second phase adjustment unit 80 may be coupled to the output terminal OUT of the amplification unit 14 via the first phase adjustment unit 163. The second phase adjustment unit 80 includes a variable capacitor Cv2. In some embodiments, the amplifier circuit 2 may employ the second phase adjustment unit 80 in place of the capacitor Co in FIG. 1. In such a case, the variable capacitor Cv2 may be a DC block capacitor and may also be used to adjust the phase of the output signal RFout. The variable capacitor Cv2 may be implemented by a varactor, a parallel-connected switch and capacitor or a serial-connected switch and capacitor. In some embodiments, the second phase adjustment unit 80 may further be used to adjust the gain of the amplifier circuit 2.

Figure 3:
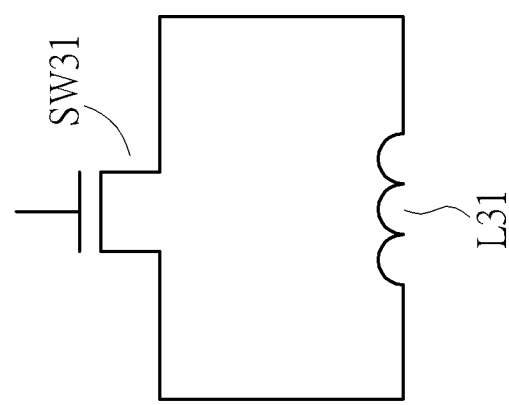
FIG. 3 is a circuit schematic of the first phase adjustment unit 161, 162 or 163 in FIG. 1.

FIG. 3 is a circuit schematic of the first phase adjustment unit 161, 162 or 163 in FIG. 1. The first phase adjustment unit 161, 162 or 163 may include a variable inductor. The variable inductor may include an inductor L31 and a switch SW31. The inductor L31 includes a first terminal coupled to the first terminal of the first phase adjustment unit 161, 162 or 163, and a second terminal coupled to the second terminal of the first phase adjustment unit 161, 162 or 163. The switch SW31 includes a first terminal coupled to the first terminal of the inductor L31, a second terminal coupled to the second terminal of the inductor L31, and a control terminal. In some embodiments, the quantity of the parallel-connected switches and inductors of the first phase adjustment unit 161, 162 or 163 may be selectively configured based on the actual applications and design requirements.

Figure 4:
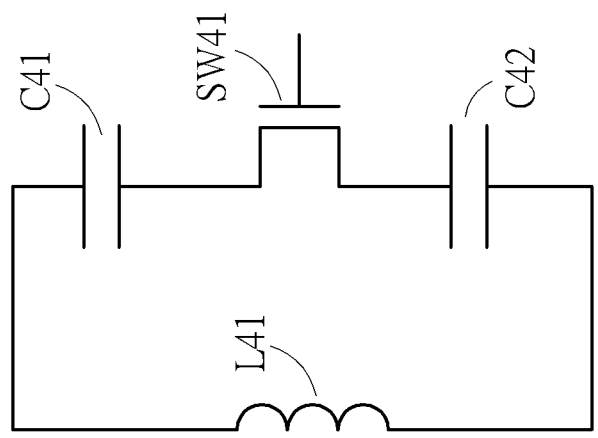
FIG. 4 is a circuit schematic of the first phase adjustment unit 164 or 165 in FIG. 1.

FIG. 4 is a circuit schematic of the first phase adjustment unit 164 or 165 in FIG. 1. The first phase adjustment unit 164 or 165 may include a variable impedance component. The variable impedance component may include an inductor L41, capacitors C41 and C42, and a switch SW41. The inductor L41 includes a first terminal coupled to the first terminal of the first phase adjustment unit 164 or 165, and a second terminal coupled to the second terminal of the first phase adjustment unit 164 or 165. The capacitor C41 includes a first terminal coupled to the first terminal of the inductor L41, and a second terminal. The switch SW41 includes a first terminal coupled to the second terminal of the capacitor C41, a second terminal, and a control terminal. The capacitor C42 includes a first terminal coupled to the second terminal of the switch SW41, and a second terminal coupled to the second terminal of the inductor L41. The capacitors C41 and C42 may be DC block capacitors and may also be used with inductor L41 to compensate for the phase change of the output signal RFout for each of the gain modes.

Figure 5:
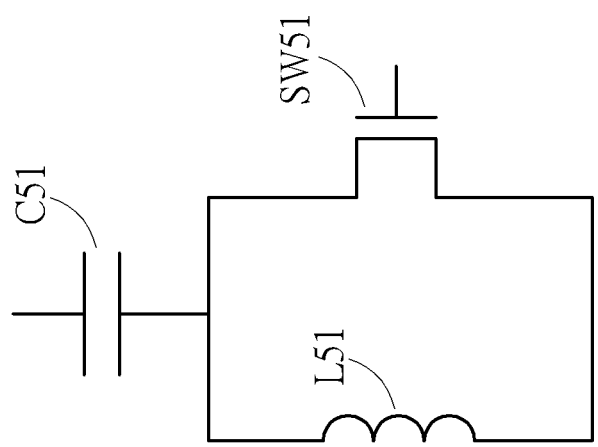
FIG. 5 is a circuit schematic of the first phase adjustment unit 166 in FIG. 1.

FIG. 5 is a circuit schematic of the first phase adjustment unit 166 in FIG. 1. The first phase adjustment unit 166 may include a variable impedance component. The variable impedance component may include a capacitor C51, an inductor L51 and a switch SW51. The capacitor C51 includes a first terminal coupled to the first terminal of the first phase adjustment unit 166, and a second terminal. The inductor L51 includes a first terminal coupled to the second terminal of the capacitor C51, and a second terminal coupled to the second terminal of the first phase adjustment unit 166. The switch SW51 includes a first terminal coupled to the first terminal of the inductor L51, a second terminal coupled to the second terminal of the inductor L51, and a control terminal. The capacitor C51 may be a DC block capacitor.

Figure 6:
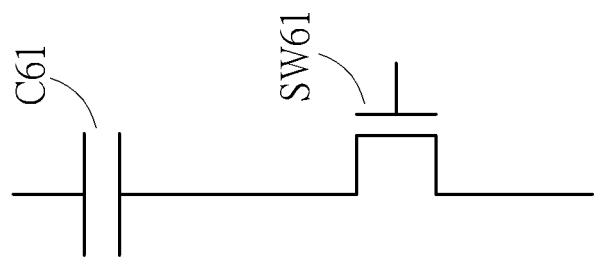
FIG. 6 is a circuit schematic of the first phase adjustment unit 167 in FIG. 1.

FIG. 6 is a circuit schematic of the first phase adjustment unit 167 in FIG. 1. The first phase adjustment unit 167 may include a variable capacitor. The variable capacitor may include a capacitor C61 and a switch SW61. The capacitor C61 includes a first terminal coupled to the first terminal of the first phase adjustment unit 167, and a second terminal. The switch SW61 includes a first terminal coupled to the second terminal of the capacitor C61, a second terminal coupled to the second terminal of the first phase adjustment unit 167, and a control terminal. In some embodiments, the capacitor C61 and the switch SW61 may swap places, so that the first terminal of the switch SW61 is coupled to the first terminal of the first phase adjustment unit 167, the second terminal of the switch SW61 is coupled to the first terminal of the capacitor C61, and the second terminal of the capacitor C61 is coupled to the second terminal of the first phase adjustment unit 167. The first phase adjustment unit 167 may further be used for input impedance matching of the amplifier circuit 1. In some embodiments, the serial-connected capacitors and switches of the first phase adjustment unit 167 may be arranged in correspondence to respective transistors in the amplification unit 14, or may be selectively arranged in correspondence to selected transistors.

Figure 7:
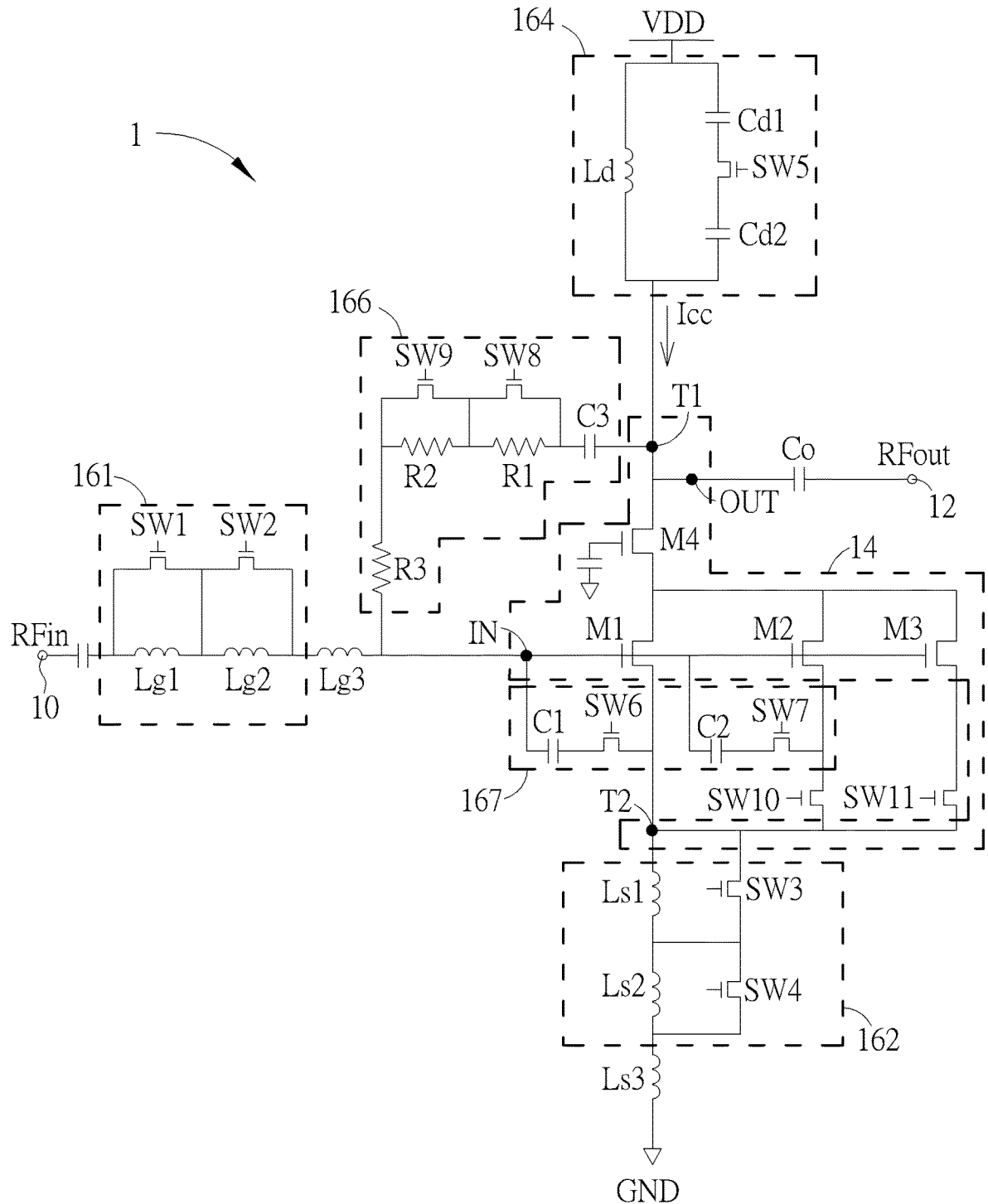
FIG. 7 is a circuit schematic of the amplifier circuit in FIG. 1.

FIG. 7 is a circuit schematic of the amplifier circuit 1 in FIG. 1. The amplifier circuit 1 may employ the first phase adjustment units 161, 162, 164, 166 and 167.

The amplification unit 14 includes transistors M1 to M4. The transistor M1 includes a first terminal, a second terminal coupled to the second terminal T2 of the amplification unit 14, and a control terminal coupled to the input terminal IN of the amplification unit 14. The transistor M2 includes a first terminal coupled to the first terminal of the transistor M1, a second terminal coupled to the second terminal of the transistor M1, and a control terminal coupled to the control terminal of the transistor M1. The transistor M3 includes a first terminal coupled to the first terminal of the transistor M2, a second terminal coupled to the second terminal of the transistor M2, and a control terminal coupled to the control terminal of the transistor M2. The transistor M4 includes a first terminal coupled to the first terminal T1 and the output terminal OUT of the amplification unit 14, a second terminal coupled to the first terminal of the transistor M1, and a control terminal.

Each of the first phase adjustment units 161 and 162 may be implemented by two sets of circuits in FIG. 3. The first phase adjustment unit 161 includes inductors Lg1, Lg2 and switches SW1, SW2, and the first phase adjustment unit 162 includes inductors Ls1 and Ls2 and switches SW3 and SW4. The first phase adjustment unit 164 may be implemented by the circuit in FIG. 4. The first phase adjustment unit 164 includes an inductor Ld, a switch SW5, and capacitors Cd1, Cd2. The first phase adjustment unit 167 may be implemented by two sets of circuits in FIG. 6. The first phase adjustment unit 167 includes a capacitor C1 and a switch SW6 corresponding to the transistor M1, and a capacitor C2 and a switch SW7 corresponding to the transistor M2. Explanations for the operations and configurations of the first phase adjustment units 161, 162, 164 and 167 may be found in the preceding paragraphs and will not be repeated here for brevity.

The first phase adjustment unit 166 in FIG. 7 shows a circuit schematic of another embodiment of the first phase adjustment unit 166 in FIG. 1. The first phase adjustment unit 166 in FIG. 7 may be configured to adjust impedance. The first phase adjustment unit 166 may include a variable impedance component. The variable impedance component may include the capacitor C3, the resistors R1 to R3 and the switches SW8 and SW9. The capacitor C3 includes a first terminal coupled to the first terminal of the first phase adjustment unit 166, and a second terminal. The resistor R1 includes a first terminal coupled to the second terminal of the capacitor C3, and a second terminal. The resistor R2 includes a first terminal coupled to the second terminal of the resistor R1, and a second terminal. The resistor R3 includes a first terminal coupled to the second terminal of the resistor R2, and a second terminal coupled to the second terminal of the first phase adjustment unit 166. The switch SW8 includes a first terminal coupled to the first terminal of the resistor R1, a second terminal coupled to the second terminal of the resistor R1, and a control terminal. The switch SW9 includes a first terminal coupled to the first terminal of the resistor R2, a second terminal coupled to the second terminal of the resistor R2, and a control terminal. The parallel-connected resistor R2 and switch SW9, the parallel-connected resistor R1 and switch SW8, and the resistor R3 may swap places. The first phase adjustment unit 166 may further be used to enhance the linearity of the amplifier circuit 1.

The amplifier circuit 1 may further include switches SW10 and SW11. Each of the switches SW10 and SW11 includes a first terminal, a second terminal, and a control terminal. The first terminal of the switch SW10 is coupled to the second terminal of the transistor M2, and the second terminal of the switch SW10 is coupled to the second terminal T2 of the amplification unit 14. The first terminal of the switch SW11 is coupled to the second terminal of the transistor M3, and the second terminal of the switch SW11 is coupled to the second terminal T2 of the amplification unit 14. The transistor size of the amplification unit 14 maybe adjusted by turning on or off the switches SW10 and/or SW11. In some embodiments, each transistor or a specific transistor of the amplification unit 14 may be correspondingly provided with a switch coupled between the second terminal T2 of the amplification unit 14 and a second terminal of each transistor or the specific transistor.

The transistors M1 to M4 and the switches SW1 to SW11 may be FET, BJT, or other types of transistors. In some embodiments, when the transistors M1 to M4 and the switches SW1 to SW11 are FETs, the first terminal may be a drain, the second terminal may be a source, and the control terminal may be a gate. When the transistors M1 to M4 and the switches SW1 to SW11 are BJTs, the first terminal may be a collector, the second terminal may be an emitter, and the control terminal may be a base. The transistors M1 to M4 and the switches SW1 to SW11 may be controlled by an internal circuit of the amplifier circuit 1 or by an external circuit other than the amplifier circuit 1 to turn on or off.

The inductor Lg3 in FIG. 7 may be regarded as the inductor Lg in FIG. 1, and the inductor Ls3 in FIG. 7 may be regarded as the inductor Ls in FIG. 1. Furthermore, in order to maintain the phase change of the output signal RFout within the predetermined range in all the gain modes, adjustments may be made to at least one of the equivalent inductance of the inductors Lg1 to Lg3, the equivalent inductance of the inductors Ls1 to Ls3, the equivalent capacitance of the capacitors Cd1 and Cd2, the equivalent inductance of the inductor Ld, the equivalent capacitance of the capacitors C1 and C2, the overall impedance of the resistors R1 to R3 and the capacitor C3, and the total width of the transistors M1 to M3.

The equivalent inductance of the inductors Lg1 to Lg3 may be controlled by the switches SW1, SW2, the equivalent inductance of the inductors Ls1 to Ls3 may be controlled by the switches SW3, SW4, the equivalent capacitance of the capacitors Cd1 and Cd2 and the equivalent inductance of the inductor Ld may be controlled by the switch SW5, the equivalent capacitance of the capacitors C1 and C2 may be controlled by the switches SW6, SW7, the overall impedance of the resistors R1 to R3 and the capacitor C3 may be controlled by the switches SW8, SW9, and the total width of the transistors M1 to M3 may be adjusted by the switches SW10, SW11.

In the high gain mode, the transistors M1 to M4 may be turned on, the switches SW3, SW4, SW10 and SW11 may be turned on and the switches SW1, SW2, SW5 to SW9 may be turned off, so as to provide the high gain while maintaining the phase change of the output signal RFout within the predetermined range. Further, the switches SW10 and SW11 may be turned on to couple the second terminals of transistors M2 and M3 to the voltage terminal GND, increasing the total width of the transistors M1 to M3, increasing the supply current Icc, and resulting in a lagging phase shift. The switches SW8 and SW9 may be turned off to select the resistors R1 and R 2, decreasing the feedback amount in the feedback path. The switches SW6 and SW7 may be turned off to decrease the equivalent capacitance of the capacitors C1 and C2, resulting in a leading phase shift. The switch SW5 may be turned off to reduce the equivalent capacitance of the capacitors Cd1 and Cd2 and the equivalent inductance of the inductor Ld, resulting in a leading phase shift. The switches SW3 and SW4 may be turned on to deselect the inductors Ls1 and Ls2, decreasing the equivalent inductance of the inductors Ls1 to Ls3, resulting in a leading phase shift. The switches SW1 and SW2 may be turned off to select the serial-connected inductors Lg1 and Lg2, increasing the equivalent inductance of the inductors Lg1 to Lg3, resulting in a lagging phase shift. That is, at least one of the transistor size of the transistors M1 to M3, the equivalent capacitance of the capacitors C1 and C2, the equivalent capacitance of the capacitors Cd1 and Cd2, the equivalent inductance of the inductor Ld, the equivalent inductance of the inductors Ls1 to Ls3 and the equivalent inductance of the inductors Lg1 to Lg3 may be adjusted based on the tolerance value T° of the phase difference between the high gain mode and the low gain mode or the target phase of the first phase, thereby compensating for the phase change in the high gain mode and maintain the phase change of the output signal RFout within the predetermined range.

In the low gain mode, the transistors M1, M2 and M4 maybe turned on, the transistor M3 may be turned off, the switches SW1, SW3, SW6, SW7, SW8, SW10 may be turned on and the switches SW2, SW4, SW5, SW9, SW11 may be turned off, so as to provide the intermediate gain while maintaining the phase change of the output signal RFout within the predetermined range. Further, the switch SW11 may be turned off to disconnect the second terminal of the transistor M3 from the voltage terminal GND, leaving the transistors M1, M2 and M4 in operation, decreasing the total width of transistors M1 to M3, decreasing the supply current Icc, and resulting in a leading phase shift. In some embodiments, the transistor M2 and the switch SW10 may be turned off instead of turning off the transistor M3 and the switch SW11 to provide the intermediate gain. The switch SW8 may be turned on to deselect the resistor R1 and the switch SW9 may be turned off to select the resistor R2, increasing the feedback amount in the feedback path. The switches SW6 and SW7 may be turned on to increase the equivalent capacitance of the capacitor C1 and the capacitor C2, resulting in a lagging phase shift. In some embodiments, only one of the switches SW6 and SW7 maybe turned on to provide a limited lagging phase shift. The switch SW5 maybe turned off to decrease the equivalent capacitance of the capacitors Cd1 and Cd2, resulting in a leading phase shift, and maintaining the equivalent inductance of the inductors Ld in the low gain mode substantially equal to that in the high gain mode. The switch SW3 may be turned on to deselect the inductor Ls1, and the switch SW4 may be turned off to select the inductor Ls 2, increasing the equivalent inductance of the inductors Ls1 to Ls3, resulting in a lagging phase shift. The switch SW1 may be turned on to deselect the inductor Lg1, and the switch SW2 may be turned off to select the inductor Lg2, decreasing the equivalent inductance of the inductors Lg1 to Lg3, resulting in a leading phase shift. That is, at least one of the transistor size of the transistors M1 to M3, the equivalent capacitance of the capacitors C1 and C2, the equivalent capacitance of the capacitors Cd1 and Cd2, the equivalent inductance of the inductor Ld, the equivalent inductance of the inductors Ls1 to Ls3 and the equivalent inductance of the inductors Lg1 to Lg3 may be adjusted based on the tolerance value T° of the phase difference between the high gain mode and the low gain mode or the tolerance value T° of the phase difference between the low gain mode and the bypass gain mode or the target phase of the second phase, thereby compensating for the phase change in the low gain mode and maintain the phase change of the output signal RFout within the predetermined range.

In the bypass mode, the transistors M1 and M4 may be turned on, the transistors M2 and M3 may be turned off, the switches SW1, SW2, SW5, SW6, SW8 and SW9 may be turned on and the switches SW3, SW4, SW7, SW10 and SW11 may be turned off, so as to provide the bypass gain while maintaining the phase change of the output signal RFout within the predetermined range. In the bypass mode, the input signal RFin is processed in a manner similar to the high gain mode and the low gain mode, that is, the input signal RFin passes through the amplification unit 14. In addition, since the bypass gain is less than 0 dB, after the input signal RFin passes through the amplification unit 14, the power of the input signal RFin will be reduced to generate the output signal RFout. In this manner, the phase of the output signal RFout in the bypass mode is substantially similar to those in the high gain mode and the low gain mode. Further, the switches SW10 and SW11 may be turned off to disconnect the second terminals of the transistors M2 and M3 from the voltage terminal GND, leaving the transistor M1 and M4 in operation, decreasing the supply current Icc, and resulting in a leading phase shift. The switches SW8 and SW9 may be turned on to deselect the resistors R1 and R2, increasing the feedback amount in the feedback path. The switch SW6 may be turned on to increase the equivalent capacitance of the capacitor C1, resulting in a lagging phase shift. The switch SW5 may be turned on to increase the equivalent capacitance of the capacitors Cd1 and Cd2 and the equivalent inductance of the inductor Ld, resulting in a lagging phase shift. The switches SW3 and SW4 may be turned off to select the inductors Ls1 and Ls2, maximizing the equivalent inductance of the inductors Ls1 to Ls3, resulting in a lagging phase shift. The switches SW1 and SW2 may be turned on to deselect the inductors Lg1 and Lg2, decreasing the equivalent inductance of the inductors Lg1 to Lg3, resulting in a leading phase shift. That is, at least one of the transistor size of the transistors M1 to M3, the equivalent capacitance of the capacitors C1 and C2, the equivalent capacitance of the capacitors Cd1 and Cd2, the equivalent inductance of the inductor Ld, the equivalent inductance of the inductors Lg1 to Lg3 and the equivalent inductance of the inductors Ls1 to Ls3 may be adjusted based on the tolerance value T° of the phase difference between the low gain mode and the bypass gain mode or the target phase of the third phase, thereby compensating for the phase change in the bypass mode and maintain the phase change of the output signal RFout within the predetermined range. In some embodiments, the amplification unit 14 are configured to have the maximum transistor size during the high gain mode, and configured to have the minimum transistor size during the bypass mode.

In addition, the equivalent inductance of the inductors Lg1 to Lg3 may affect the impedance matching of the amplifier circuit 1. The effect of the lowered equivalent capacitance of the capacitors C1 and C2 for the impedance matching will be offset by an increase in the equivalent inductance of the inductors Lg1 to Lg3. Likewise, the effect of the increased equivalent capacitance of the capacitors C1 and C2 for the impedance matching will be offset by a decrease in the equivalent inductance of the inductors Lg1 to Lg3.

The equivalent inductance of the inductors Ls1 to Ls3 may affect the gain and the linearity of the amplifier circuit 1. The linearity may be represented by the third order input intercept point (IIP3). An increase in the equivalent inductance of the inductors Ls1 to Ls3 may result in an increase in the IIP3 and a decrease in the gain. A decrease in the equivalent inductance of the inductors Ls1 to Ls3 may result in an increase in the gain and a decrease in the IIP3.

In other embodiments, the amplification unit 14 may include the transistors M1 and M4, and the transistors M2 and M3, the capacitor C2 and the switches SW7, SW10 and SW11 being removed from the amplifier circuit 1. In this circuit configuration, the transistors M1 and M4 may be turned on regardless of the amplifier circuit 1 being operated in the high gain mode, the low gain mode or the bypass mode.

Figure 8:
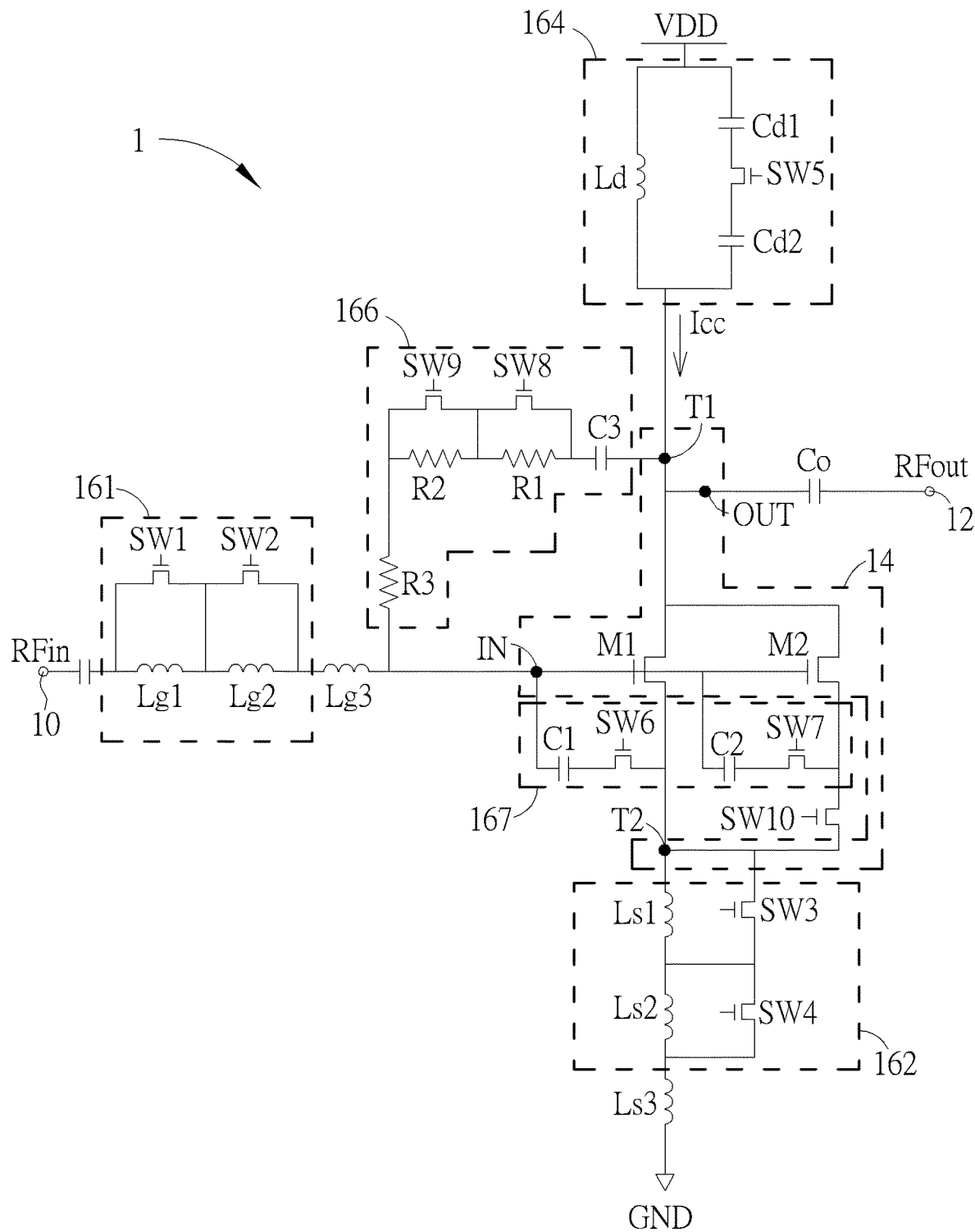
FIG. 8 is a circuit schematic of another amplifier circuit in FIG. 1.

FIG. 8 is a circuit schematic of another amplifier circuit 1 in FIG. 1. Main difference between FIG. 8 and FIG. 7 is that the amplification unit 14 in FIG. 8 includes transistors M1 and M 2, and the transistors M3 and M4, the switch SW11 being removed from the amplifier circuit 1. In FIG. 8, the first terminal of the transistor M1 is coupled to the first terminal T1 and the output terminal OUT of the amplification unit 14. In some embodiments, instead of coupling between the second terminal of the transistor M2 and the second terminal T2 of the amplification unit 14, the switch SW10 may be coupled between the second terminal of the transistor M1 and the second terminal T2 of the amplification unit 14. In other embodiments, an additional switch may be arranged between the second terminal of the transistor M1 and the second terminal T2 of the amplification unit 14. In some embodiments, the transistors M1 and M2 may be turned on based on actual applications and design requirements. For example, in the high gain mode, the transistors M1 and M2 may be turned on; in the low gain mode or the bypass mode, at least one of the transistors M1 and M2 may be turned on. That is, at least one of the transistors M1 and M2 maybe turned on regardless of the amplifier circuit 1 being operated in the high gain mode, the low gain mode or the bypass mode.

Figure 9:
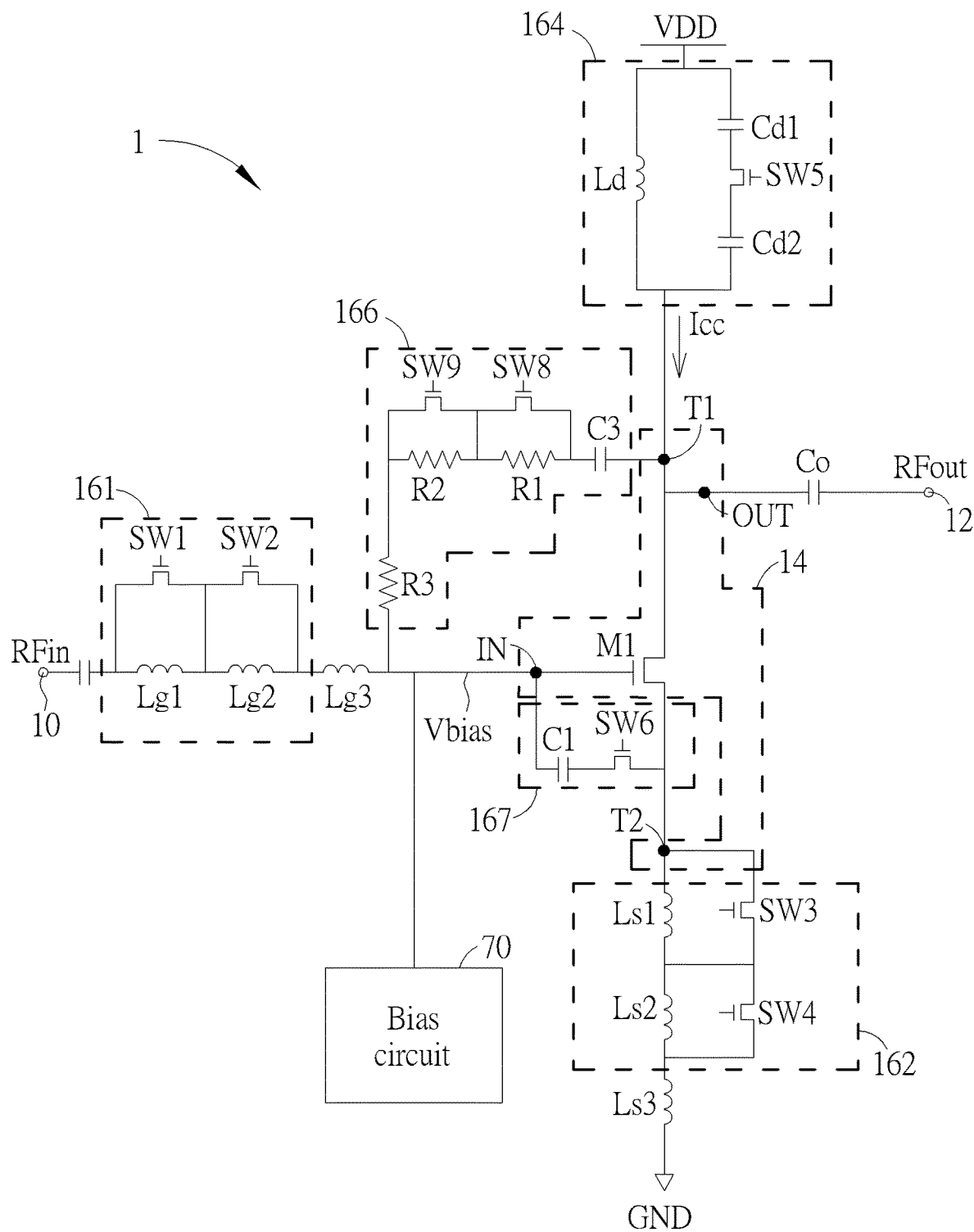
FIG. 9 is a circuit schematic of another amplifier circuit in FIG. 1.

FIG. 9 is a circuit schematic of another amplifier circuit 1 in FIG. 1. The main difference between FIG. 9 and FIG. 7 is that the amplification unit 14 in FIG. 9 includes the transistor M1, and the transistors M2 to M4, and the capacitor C2 and the switches SW7, SW10 and SW11 are removed from the amplifier circuit 1. In FIG. 9, the first terminal of the transistor M1 is coupled to the first terminal T1 and the output terminal OUT of the amplification unit 14. The amplifier circuit 1 may further include a bias circuit 70 for providing a bias voltage Vbias to the control terminal of the transistor M1, so as to control the gain of the amplifier circuit 1. For example, the bias voltage Vbias may be set at a highest voltage level for the amplifier circuit 1 to provide the high gain in the high gain mode, the bias voltage Vbias may be set at an intermediate voltage level for the amplifier circuit 1 to provide the intermediate gain in the low gain mode, and the bias voltage Vbias maybe set at a lowest voltage level for the amplifier circuit 1 to provide the bypass gain in the bypass mode. The transistor M1 may be turned on regardless of the amplifier circuit 1 being operated in the high gain mode, the low gain mode or the bypass mode. In some embodiments, the amplifier circuit 1 in FIG. 1, FIG. 7 or FIG. 8 may adopt the bias circuit 70 for providing a bias voltage Vbias to the control terminal of the transistor M1, so as to control the gain of the amplifier circuit 1.

The embodiments of the amplifier circuit employs at least one first phase adjustment unit to maintain the phase of the output signal substantially unchanged or varying within a predetermined range while achieving various gain levels in various gain modes and reducing the signal processing time in the electronic system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit comprising:
   an input terminal configured to receive an input signal;
   an output terminal configured to output an output signal;
   an amplification unit comprising an input terminal coupled to the input terminal of the amplifier circuit, an output terminal coupled to the output terminal of the amplifier circuit, a first terminal coupled to a first voltage terminal, and a second terminal coupled to a second voltage terminal, wherein the first voltage terminal provides an operating voltage; and
   a first phase adjustment unit comprising a variable impedance component, a first terminal and a second terminal;
   wherein the first terminal of the first phase adjustment unit is coupled to the first terminal of the amplification unit, and the second terminal of the first phase adjustment unit is coupled to the input terminal of the amplification unit;
   wherein when the amplifier circuit is operated in a first mode, the output signal has a first phase;
   when the amplifier circuit is operated in a second mode, the output signal has a second phase;
   when the amplifier circuit is operated in a third mode, the output signal has a third phase;
   a difference between the first phase and the second phase is within a predetermined range; and
   a difference between the second phase and the third phase is within the predetermined range.

2. The amplifier circuit of the claim 1, wherein the predetermined range is from 0 degrees to 25 degrees.

3. The amplifier circuit of the claim 1, wherein when the amplifier circuit is operated in the first mode, the amplifier circuit has a first gain, and when the amplifier circuit is operated in the second mode, the amplifier circuit has a second gain, the first gain being larger than the second gain.

4. The amplifier circuit of the claim 3, wherein:
   the amplifier circuit is configured to operate in the first mode when the input signal has a first power; and
   the amplifier circuit is configured to operate in the second mode when the input signal has a second power higher than the first power.

5. The amplifier circuit of the claim 1, further comprising a third phase adjustment unit comprising a variable inductor, a first terminal and a second terminal:
   wherein:
   the first terminal of the third phase adjustment unit is coupled to the input terminal of the amplifier circuit, and the second terminal of the third phase adjustment unit is coupled to the input terminal of the amplification unit; or
   the first terminal of the third phase adjustment unit is coupled to the second terminal of the amplification unit, and the second terminal of the third phase adjustment unit is coupled to the second voltage terminal; or
   the first terminal of the third phase adjustment unit is coupled to the output terminal of the amplification unit, and the second terminal of the third phase adjustment unit is coupled to the output terminal of the amplifier circuit.

6. The amplifier circuit of the claim 1, further comprising a third phase adjustment unit comprising a variable impedance component, a first terminal and a second terminal:
   wherein:
   the first terminal of the third phase adjustment unit is coupled to the first voltage terminal, and the second terminal of the third phase adjustment unit is coupled to the first terminal of the amplification unit; or
   the first terminal of the third phase adjustment unit is coupled to the input terminal of the amplification unit, and the second terminal of the third phase adjustment unit is coupled to the second voltage terminal.

7. The amplifier circuit of the claim 1, further comprising a second phase adjustment unit comprising a first terminal coupled to the output terminal of the amplification unit, and a second terminal coupled to the output terminal of the amplifier circuit.

8. The amplifier circuit of the claim 7, wherein the second phase adjustment unit comprises a variable capacitor.

9. The amplifier circuit of the claim 1, wherein;
   when the amplifier circuit is operated in the first mode, the amplifier circuit has a first gain, and when the amplifier circuit is operated in the second mode, the amplifier circuit has a second gain, the first gain being larger than the second gain; and
   when the amplifier circuit is operated in the third mode, the amplifier circuit has a third gain, the second gain being larger than the third gain.

10. The amplifier circuit of the claim 1, wherein:
    one of the first phase, the second phase and the third phase is selected as a reference phase of the amplifier circuit;
    the reference phase has a target phase of N degrees;

a remaining one of the first phase, the second phase and the third phase has a target phase of (N+T) degrees or (N−T) degrees;

N is a value from −180 to 180; and

T is a value from 0 to 25.

11. The amplifier circuit of the claim 1, wherein the amplification unit comprises:

a first transistor comprising a first terminal coupled to the first terminal and the output terminal of the amplification unit, a second terminal coupled to the second terminal of the amplification unit, and a control terminal coupled to the input terminal of the amplification unit.

12. The amplifier circuit of the claim 1, wherein the amplification unit comprises:

a second transistor comprising a first terminal coupled to the first terminal and the output terminal of the amplification unit, a second terminal coupled to the second terminal of the amplification unit, and a control terminal coupled to the input terminal of the amplification unit; and a third transistor comprising a first terminal coupled to the first terminal of the second transistor, a second terminal coupled to the second terminal of the second transistor, and a control terminal coupled to the control terminal of the second transistor.

13. The amplifier circuit of the claim 11, wherein:

when the amplifier circuit is operated in the third mode, the first transistor is turned on, the amplifier circuit has a third gain, and the third gain is less than 0 dB.

14. The amplifier circuit of the claim 12, wherein:

when the amplifier circuit is operated in the third mode, at least one of the second transistor and the third transistor is turned on, the amplifier circuit has a third gain, and the third gain is less than 0 dB.

15. The amplifier circuit of the claim 12, further comprising a first switch comprising a first terminal, a second terminal, and a control terminal;

wherein the first terminal of the first switch is coupled to the second terminal of the second transistor, and the second terminal of the first switch is coupled to the second terminal of the amplification unit; or the first terminal of the first switch is coupled to the second terminal of the third transistor, and the second terminal of the first switch is coupled to the second terminal of the amplification unit.

16. An amplifier circuit comprising:

an input terminal configured to receive an input signal;

an output terminal configured to output an output signal;

an amplification unit comprising:

an input terminal coupled to the input terminal of the amplifier circuit;

an output terminal coupled to the output terminal of the amplifier circuit;

a first terminal coupled to a first voltage terminal, wherein the first voltage terminal provides an operating voltage; and a second terminal coupled to a second voltage terminal;

a first phase adjustment unit comprising a variable impedance component, a first terminal and a second terminal; and a third phase adjustment unit comprising a variable capacitor, a first terminal and a second terminal;

wherein the first terminal of the first phase adjustment unit is coupled to the first terminal of the amplification unit, and the second terminal of the first phase adjustment unit is coupled to the input terminal of the amplification unit;

wherein the first terminal of the third phase adjustment unit is coupled to the input terminal of the amplification unit, and the second terminal of the third phase adjustment unit is coupled to the second terminal of the amplification unit;

wherein when the amplifier circuit is operated in a first mode, the output signal has a first phase, when the amplifier circuit is operated in a second mode, the output signal has a second phase; and a difference between the first phase and the second phase is within a predetermined range.

17. An amplifier circuit comprising:

an input terminal configured to receive an input signal;

an output terminal configured to output an output signal;

an amplification unit comprising:

an input terminal coupled to the input terminal of the amplifier circuit;

an output terminal coupled to the output terminal of the amplifier circuit;

a first terminal coupled to a first voltage terminal, wherein the first voltage terminal provides an operating voltage;

a second terminal coupled to a second voltage terminal;

a fourth transistor comprising a first terminal, a second terminal coupled to the second terminal of the amplification unit, and a control terminal coupled to the input terminal of the amplification unit;

a fifth transistor comprising a first terminal coupled to the first terminal of the fourth transistor, a second terminal coupled to the second terminal of the fourth transistor, and a control terminal coupled to the control terminal of the fourth transistor; and a sixth transistor comprising a first terminal coupled to the first terminal and the output terminal of the amplification unit, a second terminal coupled to the first terminal of the fourth transistor, and a control terminal; and a first phase adjustment unit comprising a variable impedance component, a first terminal and a second terminal;

wherein the first terminal of the first phase adjustment unit is coupled to the first terminal of the amplification unit, and the second terminal of the first phase adjustment unit is coupled to the input terminal of the amplification unit;

wherein when the amplifier circuit is operated in a first mode, the output signal has a first phase, and when the amplifier circuit is operated in a second mode, the output signal has a second phase; and a difference between the first phase and the second phase is within a predetermined range.

18. The amplifier circuit of the claim 17, wherein:

when the amplifier circuit is configured to operate in a third mode, the fourth transistor and the sixth transistor are turned on, the amplifier circuit has a third gain, and the third gain is less than 0 dB.

19. The amplifier circuit of the claim 17, further comprising a second switch comprising a first terminal, a second terminal, and a control terminal;

wherein the first terminal of the second switch is coupled to the second terminal of the fourth transistor, and the second terminal of the second switch is coupled to the second terminal of the amplification unit; or the first terminal of the second switch is coupled to the second terminal of the fifth transistor, and the second terminal of the second switch is coupled to the second terminal of the amplification unit.

* * * * *